(12) United States Patent
Anderson et al.

(10) Patent No.: US 8,658,248 B2
(45) Date of Patent: Feb. 25, 2014

(54) METHOD FOR ATOMIZING MATERIAL FOR COATING PROCESSES

(75) Inventors: Edward J. Anderson, Somerset, WI (US); Jesus R. Ramos, Tucson, AZ (US)

(73) Assignee: 3M Innovative Properties Company, St. Paul, MN (US)

( * ) Notice: Subject to any disclaimer, the term of this patent is extended or adjusted under 35 U.S.C. 154(b) by 797 days.

(21) Appl. No.: 12/159,021

(22) PCT Filed: Dec. 28, 2006

(86) PCT No.: PCT/US2006/049432
§ 371 (c)(1),
(2), (4) Date: Jun. 24, 2008

(87) PCT Pub. No.: WO2008/030262
PCT Pub. Date: Mar. 13, 2008

(65) Prior Publication Data
US 2008/0292810 A1    Nov. 27, 2008

Related U.S. Application Data

(60) Provisional application No. 60/754,914, filed on Dec. 29, 2005.

(51) Int. Cl.
*B05D 1/02* (2006.01)

(52) U.S. Cl.
USPC ............. 427/255.28; 427/421.1; 427/565; 427/600; 239/4; 239/8; 239/398

(58) Field of Classification Search
USPC ........ 427/255.28, 421.1, 565, 600; 239/4, 8, 239/398
See application file for complete search history.

(56) References Cited

U.S. PATENT DOCUMENTS 4,063,686 A * 12/1977 Willis .................. 239/404
4,337,896 A    7/1982 Berger et al.
(Continued)

FOREIGN PATENT DOCUMENTS

FR    2 859 650    3/2005
JP    63-503552    12/1988
(Continued)

OTHER PUBLICATIONS

Sindayihebura et al., "Experimental Study of Thin Liquid Film Ultrasonic Atomization", Universite catholique de Louvain, Louvain-la Neuve, Belgium, pp. 1-7.

*Primary Examiner* — Timothy Meeks
*Assistant Examiner* — Nathan T Leong
(74) *Attorney, Agent, or Firm* — Pamela L. Stewart; Lisa P. Fulton; James A. Baker

(57) ABSTRACT

A method for atomizing a liquid including providing an atomizer having a liquid supply conduit having an outlet at one end, a gas supply conduit opening into a port in the liquid supply conduit upstream of the outlet, and a means for imparting vibrational energy to the atomizer. In an embodiment, the liquid supply conduit and gas supply conduit are coaxially displaced relative to one another. The method further includes flowing liquid through the liquid supply conduit to the outlet while simultaneously flowing gas through the gas supply conduit, and imparting vibrational energy to the atomizer to atomize the liquid exiting from the outlet. The introduction of gas at the port results in a spray of droplets with improved dimensional properties.

31 Claims, 2 Drawing Sheets

(56) References Cited

U.S. PATENT DOCUMENTS

| | | | |
|---|---|---|---|
| 4,647,818 A | 3/1987 | Ham | |
| 4,696,719 A | 9/1987 | Bischoff | |
| 4,842,893 A | 6/1989 | Yializis et al. | |
| 4,954,371 A * | 9/1990 | Yializis | 427/497 |
| 5,032,461 A | 7/1991 | Shaw et al. | |
| 5,061,509 A | 10/1991 | Naito et al. | |
| 5,138,520 A * | 8/1992 | McMillan et al. | 361/311 |
| 5,440,446 A | 8/1995 | Shaw et al. | |
| 5,725,909 A | 3/1998 | Shaw et al. | |
| 5,869,127 A | 2/1999 | Zhong | |
| 5,877,895 A | 3/1999 | Shaw et al. | |
| 6,045,864 A | 4/2000 | Lyons et al. | |
| 6,172,810 B1 | 1/2001 | Fleming et al. | |
| 6,203,898 B1 | 3/2001 | Kohler et al. | |
| 6,207,238 B1 | 3/2001 | Affinito | |
| 6,207,239 B1 | 3/2001 | Affinito | |
| 6,228,436 B1 * | 5/2001 | Affinito | 427/497 |
| 6,231,939 B1 | 5/2001 | Shaw et al. | |
| 6,284,050 B1 | 9/2001 | Shi et al. | |
| 6,349,887 B1 | 2/2002 | Pyo | |
| 6,357,880 B2 | 3/2002 | Epstein et al. | |
| 6,420,003 B2 | 7/2002 | Shaw et al. | |
| 6,468,595 B1 | 10/2002 | Mikhael et al. | |
| 6,475,571 B1 | 11/2002 | Echigo et al. | |
| 6,544,600 B2 | 4/2003 | Affinito et al. | |
| 6,656,537 B2 | 12/2003 | Affinito et al. | |
| 6,660,339 B1 | 12/2003 | Datta et al. | |
| 6,682,782 B2 | 1/2004 | Jung et al. | |
| 6,794,196 B2 | 9/2004 | Fonash et al. | |
| 6,803,069 B2 | 10/2004 | Patnaik et al. | |
| 6,811,829 B2 | 11/2004 | Affinito et al. | |
| 6,815,043 B2 | 11/2004 | Fleming et al. | |
| 6,818,291 B2 | 11/2004 | Funkenbusch et al. | |
| 6,866,901 B2 * | 3/2005 | Burrows et al. | 428/1.5 |
| 6,929,864 B2 | 8/2005 | Fleming et al. | |
| 2002/0022156 A1 | 2/2002 | Bright | |
| 2003/0124392 A1 | 7/2003 | Bright | |
| 2004/0184948 A1 | 9/2004 | Rakow et al. | |
| 2004/0195967 A1 | 10/2004 | Padiyath et al. | |
| 2004/0202708 A1 | 10/2004 | Roehrig et al. | |
| 2005/0037218 A1 | 2/2005 | Lottes et al. | |
| 2005/0089673 A1 | 4/2005 | Fleming et al. | |
| 2007/0125882 A1 | 6/2007 | Schwal et al. | |

FOREIGN PATENT DOCUMENTS

| | | | |
|---|---|---|---|
| JP | 2000-355757 | | 12/2000 |
| JP | 2003-514994 | | 4/2003 |
| JP | 2003-298131 | | 10/2003 |
| JP | 2004-211183 | | 7/2004 |
| JP | 2004211183 | * | 7/2004 |
| JP | 16-211183 | | 6/2005 |
| JP | 2005-259723 | | 9/2005 |
| WO | 87/07848 | | 12/1987 |
| WO | 01/38601 | | 5/2001 |

* cited by examiner

METHOD FOR ATOMIZING MATERIAL FOR COATING PROCESSES

CROSS REFERENCE TO RELATED APPLICATIONS

This application is a national stage filing under 35 U.S.C. 371 of PCT/US2006/049432, filed Dec. 28, 2006, which claims priority to U.S. Provisional Application No. 60/754,914, filed Dec. 29, 2005, the disclosure of which is incorporated by reference in their entirety herein.

TECHNICAL FIELD

The present invention is related to the atomization of liquid material, particularly for the creation of vapors for continuous chemical deposition processes.

BACKGROUND

The use of chemical or monomer vapor deposition techniques have been advantageously applied to the preparation of a number of useful products. For example, effective moisture and oxygen barrier films have been prepared by applying to a substrate alternating layers of metal oxides by sputtering techniques and polymeric layers by vapor deposition techniques. The moisture and oxygen barrier properties and flexibility of such films make them useful for a wide variety of applications, such as food and drug packaging and protective films for electronic devices, such as solar cells, OLED (Organic Light Emitting Diode) devices, and organic microelectronic devices.

In the fabrication of the polymeric film layers by monomer vapor deposition, it is known to supply a polymerizable monomer to an atomizer, and then to pass the atomized liquid droplets through a vaporization chamber before directing the vaporized monomer onto a target surface. The vaporized monomer is subsequently polymerized, for example, by ultraviolet radiation, to form a thin layer of polymeric material with beneficial properties.

In the fabrication of inorganic film layers by chemical vapor deposition, it is known to supply an organic or organometallic precursor to an atomizer, and then to pass the atomized liquid droplets through a vaporization chamber before directing the vaporized precursor toward a target surface. At the target surface, the vaporized precursor is reacted with other gaseous or vapor material, for example, by thermal energy or plasma, to form a thin layer of inorganic material with beneficial properties.

In the fabrication of polymeric or bioactive film layers by spray coating, it is known to supply a solution of polymer or bioactive material and solvent (organic or aqueous) to an atomizer, and then to direct the atomized liquid droplets toward a target surface to form a coating of thin polymeric or bioactive material with beneficial properties.

SUMMARY

The present disclosure relates to an apparatus and method for the atomization and evaporation of liquids, and articles made from the atomization method. When used with vapor coating processes, the method disclosed provides smaller droplet size, improved droplet size uniformity, and improved droplet size stability over time. The improved droplet uniformity and stability leads to improved uniformity of the evaporation rate, vapor flow rate, and coating thickness relative to prior methods.

Ultrasonic atomizers have been used to deliver a fine spray of liquid droplets for various applications. However, both ultrasonic and more conventional types of atomizers fail to achieve reduced droplet size, good size uniformity of the droplets, and stability of the size of the droplets over time.

In an embodiment, a method for atomizing a liquid is disclosed, wherein the method comprises: (1) providing an atomizer comprising a liquid supply conduit having an outlet at one end, a gas supply conduit opening into the liquid supply conduit upstream of the outlet, and means for imparting vibrational energy to the outlet; (2) flowing liquid through the liquid supply conduit to the outlet while simultaneously flowing gas through the gas supply conduit; and (3) imparting vibrational energy to the atomizer to atomize the liquid exiting from the outlet. In an embodiment, the liquid and gas conduits are coaxially displaced relative to one another.

In a further embodiment, a method of coating a substrate is disclosed, wherein the method comprises: (1) providing a substrate; (2) providing an atomizer comprising a liquid supply conduit having an outlet at one end, a gas supply conduit opening into the liquid supply conduit upstream of the outlet, and means for imparting vibrational energy to the outlet; (3) flowing liquid through the liquid supply conduit to the outlet while simultaneously flowing gas through the gas supply conduit; and (4) imparting vibrational energy to the atomizer to atomize the liquid exiting from the outlet onto the substrate.

In another embodiment, a method for coating a substrate is disclosed, wherein the method comprises: (1) providing a substrate; (2) providing an atomizer comprising a liquid supply conduit having an outlet at one end, a gas supply conduit opening into the liquid supply conduit upstream of the outlet, and means for imparting vibrational energy to the outlet; (3) flowing liquid through the liquid supply conduit to the outlet while simultaneously flowing gas through the gas supply conduit; and (4) imparting vibrational energy to the atomizer from the means to atomize the liquid exiting from the outlet, evaporating the liquid to form a vapor, and condensing the vapor onto the substrate.

In yet a further embodiment, a method for coating a substrate is disclosed, wherein the method comprises: (1) providing a substrate; (2) providing an atomizer comprising a liquid supply conduit having an outlet at one end, a gas supply conduit opening into the liquid supply conduit upstream of the outlet, and means for imparting vibrational energy to the outlet; (3) flowing liquid through the liquid supply conduit to the outlet while simultaneously flowing gas through the gas supply conduit; and (4) imparting vibrational energy to the atomizer from the means to atomize the liquid exiting from the outlet, evaporating the liquid to form a vapor, and contacting the vapor with the substrate surface in the presence of a reactive gas.

(Note: the steps above are numbered for the sake of clarity, and are not intended to imply that the steps must be carried out in any particular order).

DETAILED DESCRIPTION

Figure 1:
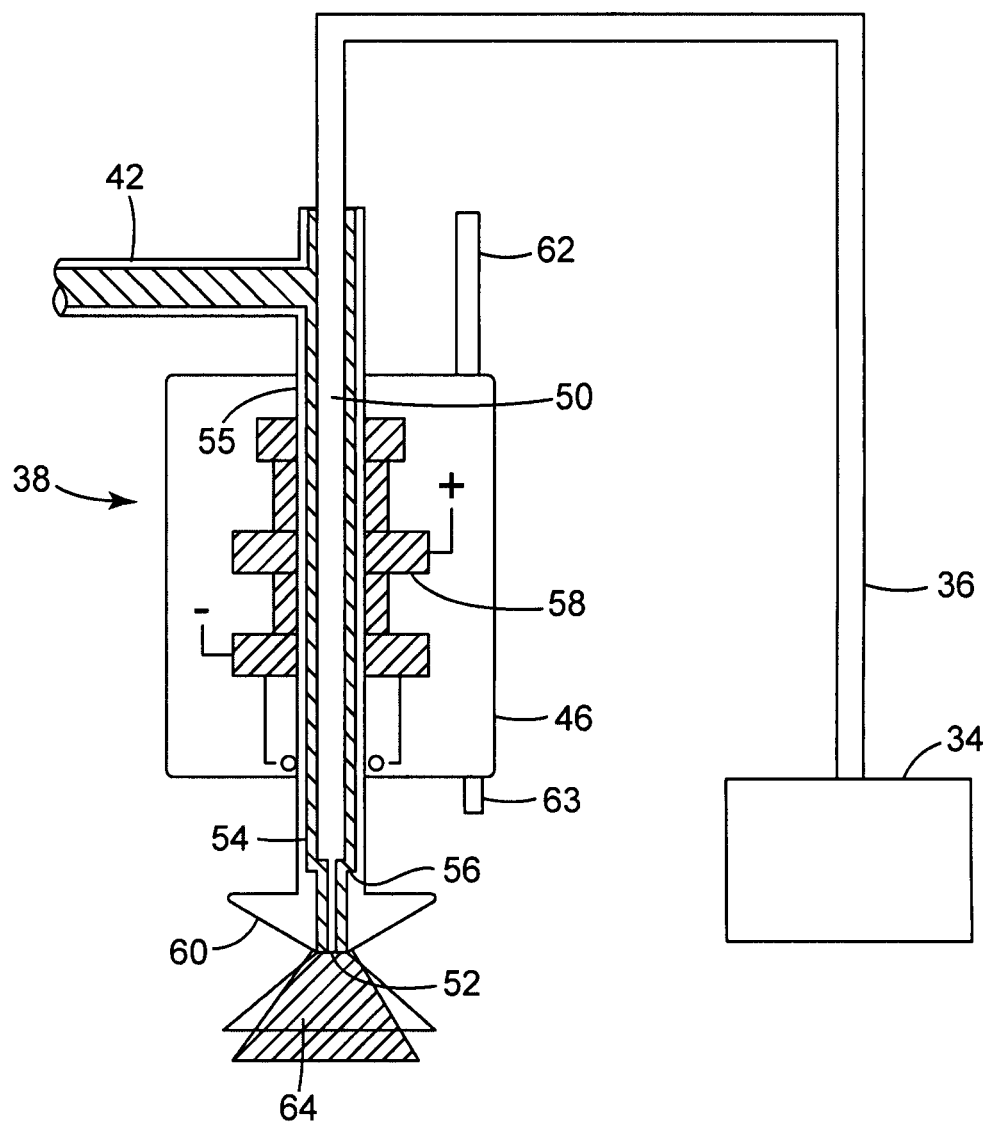
FIG. 1 shows a cross sectional view of an atomizer.

Referring now to FIG. 1, a cross sectional view of an atomizer 38 is shown. The atomizer 38 contains a nozzle body 55 partially contained in an outer housing 46, and is depicted connected at one end to a source for liquid material 34 by liquid delivery line 36. At the opposite end, the atomizer nozzle body 55 contains an atomizing surface 60 from which liquid material 34 entering the atomizer 38 is atomized.

The liquid delivery line 36, which supplies liquid material to the atomizer 38, is attached to a liquid supply conduit 50, which terminates at one end in an outlet 52, located at the center of the atomizing surface 60 of the atomizer 38. A gas supply conduit 54 supplies gas from a gas delivery line 42 to the atomizer 38. The gas supply conduit 54 opens into the liquid supply conduit 50 at a port 56 upstream of the outlet 52. In an embodiment, the gas supply conduit 54 opens into the liquid supply conduit around at least 80 percent of the bore of the liquid supply conduit 50. In another embodiment, the gas supply conduit 54 opens into the liquid supply conduit around less than 80 percent of the bore. As may be appreciated by one skilled in the art, a range of configurations may be used to carry out the method.

In further embodiments, the gas supply conduit 54 opens into the liquid supply conduit around 100 percent of the bore of the liquid supply conduit 50. In this embodiment, the liquid supply conduit 50 and the gas supply conduit 54 are coaxially displaced relative to one another. Once combined in the region of the atomizer between the port 56 and outlet 52, the liquid and gas streams exit the outlet 52, and are atomized from the atomizing surface 60 of the atomizer 38.

The atomizer 38 further contains a means for imparting vibrational energy 58 to the nozzle body 55. Suitable means for imparting vibrational energy include transducers capable of converting electrical energy into mechanical energy or vibrational energy. In an embodiment, an ultrasonic atomizer employed, which utilizes piezoelectric transducers to convert electrical energy into mechanical energy. The transducers receive electrical input from a power generator and convert that energy into vibrational motion at the same frequency.

The conical head of the atomizing surface 60 adjacent to the outlet 52 provides a spray pattern 64 that is spread out, making this type of atomization device well suited for applications which require thin, uniform coverage over a surface. In other embodiments, the atomizing surface 60 may be configured as a flat or nearly-flat surface to provide a more narrow spray pattern. In some embodiments, cooling air entering from a coolant supply port 62 and exiting a coolant outlet port 63 is used to keep the piezoelectric ultrasonic vibrator from overheating. An exemplary piezoelectric ultrasonic atomizer is disclosed in U.S. Pat. No. 4,337,896 (Berger et al.), incorporated by reference herein.

Suitable materials for use with the atomization process disclosed herein include monomers, oligomers, resins, waxes, organic compounds, organometallic compounds, biologically active materials and combinations thereof. These materials can be liquids at room temperature, or melted solids at elevated temperature. In an embodiment, (meth)acrylate monomers are deposited by the atomization method described herein. Suitable (meth)acrylate monomers are disclosed in the following patents, incorporated by reference herein: U.S. Pat. No. 5,440,446 (Shaw, et al.); U.S. Pat. No. 5,725,909 (Shaw et al.); U.S. Pat. No. 6,231,939 (Shaw et al.); U.S. Pat. No. 6,420,003 (Shaw et al.).

Other suitable materials for use with the atomization process include but are not limited to, epoxies, vinyl ethers, fluoro-containing polymers, styrene containing polymers, acetylenes, polyamides, acrylamides, parylenes, waxes, fluoropolyethers, polyamines, diallyldiphenylsilanes, metal alkoxides, metal alkyls, silicones, oils, dyes, proteins, peptides, polypeptides, lipids, carbohydrates, enzymes, nucleic acids, polynucleic acids, drugs, drug metabolites, cells, cell material, and micro-organisms, as described in the following U.S. patents, incorporated by reference herein: U.S. Pat. No. 6,468,595 (Mikhael et al.); U.S. Pat. No. 6,660,339 (Datta et al.); U.S. Pat. No. 6,544,600 (Affinito et al.); U.S. Pat. No. 6,811,829 (Affinito et al.); U.S. Pat. No. 6,682,782 (Jung et al.); U.S. Pat. No. 6,656,537 (Affinito et al.); U.S. Pat. No. 6,475,571 (Echigo et al.); U.S. Pat. No. 6,284,050 (Shi et al.); U.S. Pat. No. 6,207,238 and U.S. Pat. No. 6,207,239 (Affinito); U.S. Pat. No. 5,061,509 (Naito et al.); U.S. Pat. No. 6,045,864 (Lyons et al.); 2005/0089673 (Fleming et al.); U.S. Pat. No. 6,203,898 (Kohler et al.); U.S. Pat. No. 6,794,196 (Fonash et al.); U.S. Pat. No. 6,803,069 (Patniak et al.); and U.S. Pat. No. 5,869,127 (Zhong et al.).

A variety of reactive and non-reactive gases may be appropriate for use in the atomization process described herein. Suitable inert gases for use with the process include nitrogen, argon, helium and neon. In an embodiment, nitrogen is used. Nitrogen can also be used as a reactive gas for CVD or plasma enhanced CVD. Other reactive gases such as oxygen, ozone, nitrous oxide, hydrogen, hydrogen sulfide, carbon tetrafluoride, methane, and ammonia may also be used in the process disclosed herein.

In order to facilitate atomization, the liquid and gas material used in the atomization process may be heated or cooled. The liquid and gas streams may be independently heated or cooled from temperatures ranging from below room temperature to any temperature below the degradation temperature of the liquid material and below the temperature limit of the atomizer. Some ultrasonic atomizers have an upper temperature limit of about 150° C. In an embodiment, the liquid stream is heated to about 50° C. In an embodiment, the gas stream is heated to about 100° C.

The process disclosed is generally carried out using relatively low gas flow rates, for example, less than 0.5 liters per minute (500 standard cubic centimeters per minute (SCCM)). In an embodiment, the gas flow rate is less than 20 SCCM. Suitable liquid flow rates for the atomization process disclosed herein range from about 0.01 to about 30 milliliters per minute. In an embodiment, the liquid flow rate is about 0.1 to about 5 milliliters per minute.

Referring now to FIG. 2, a roll-to-roll process 10 for developing multi-layer coatings is illustrated, in which an atomizer 38 as described above may be utilized. In the process 10, a substrate 12 is unwound from a first roll 14, directed around a process drum 16 by idler 18, and directed towards a second roll 20 by idler 22. The process may be carried out in a vacuum chamber (or in a controlled-atmosphere chamber at atmospheric or higher pressures) 24 containing various tools for the deposition of metal oxides or other suitable materials, and may include a plasma treatment station 26 for the treatment of the surface of the substrate, and metal sputter stations 28 and 30, for the deposition of metallic layers such as metal oxides. Also within the chamber 24, are tools for the vapor deposition of liquid materials, such as the liquid monomers described above. A vapor generator 32 includes a dispenser of liquid monomer 34 connected by a liquid delivery line 36 to an atomizer 38, and a gas delivery line 42 through which gas is delivered to the atomizer 38 from a gas dispenser 40.

In the atomization process, a spray of droplets formed by atomizer 38 is directed into a vaporizer 43 to turn the monomer completely into vapor. The vapor is projected from a nozzle 44 onto the substrate 12, where it condenses. As the substrate advances in contact with the process drum 16, rotating in direction "D", it may be advanced to a curing source 21 capable of initiating polymerization of the liquid monomer. Suitable sources 21 include ultraviolet radiation, heat, plasma, and electron beam irradiation.

In an embodiment, the process drum is provided with a coolant circulation so that it can be chilled, the better to promote condensation of liquid vapor on substrate 12.

The atomization and coating process described herein may be run at line speeds ranging from about 0.1 to about 1500 feet per minute (about 0.05 to about 760 centimeters per second). In an embodiment, the process is run at a linespeed of about 1 feet/minute (about 0.5 cm/second) to about 400 feet/minute (about 200 cm/second).

The process may be carried out under vacuum conditions, atmospheric pressure, or elevated pressure. In an embodiment, the process is carried out under pressure of about $10^{-5}$ Torr to about 800 Torr. In a further embodiment, the process is carried out at a pressure of about $10^{-4}$ Torr to about 2 Torr.

Suitable substrates for use in the process disclosed herein include flexible materials capable of roll-to-roll processing, such as paper, polymeric materials and combinations thereof. Particularly useful polymeric substrates include various polyolefins, e.g. polypropylene (PP), various polyesters (e.g. polyethylene terephthalate (PET), fluorene polyester (FPE)), polymethylmethacrylate (PMMA) and other polymers such as polyethylene naphthalate (PEN), polyethersulphone (PES), polyestercarbonate (PC), polyetherimide (PEI), polyarylate (PAR), polyimide (PI). Further useful materials include polycyclic olefins, such as those sold under the trade names ARTON™ (Japanese Synthetic Rubber Co., Tokyo, Japan) and AVATREL™ (B.F. Goodrich, Brecksville, Ohio).

In some cases, the substrate is a discrete part rather than a continuous roll of film. The discrete part may move past the vapor source, or the discrete part may be stationary during the coating process. Suitable substrates include silicon wafers, electronic or optical devices, glass, metal, and plastic parts.

The process described above is useful for forming polymeric substrates with a cross-linked polymer layer which, when combined with additional layers of, for example, metal or metal oxides limit permeation of gases such as oxygen and water vapor. Such barrier films and processes for the preparation of barrier films are described in the following U.S. patents and publications, incorporated by reference herein: U.S. Pat. No. 5,440,446 (Shaw, et al.); U.S. Pat. No. 5,725,909 (Shaw et al.); U.S. Pat. No. 6,231,939 (Shaw et al.); U.S. Pat. No. 6,420,003 (Shaw et al.); U.S. Pat. No. 4,647,818 (Ham); U.S. Pat. No. 4,696,719 (Bischoff); U.S. Pat. No. 4,842,893 (Yializis et al.); U.S. Pat. No. 4,954,371 (Yializis); U.S. Pat. No. 5,032,461 (Shaw et al.); 2002/0022156 (Bright), 2004/0195967 (Padiyath et al.), 2004/0202708 (Roehrig et al.), 2005/0037218 (Lottes et al.).

The atomization process disclosed herein may be further utilized in chemical vapor deposition (CVD) processes, and plasma enhanced chemical vapor deposition (PECVD) processes. In these processes, the atomized precursor material is evaporated in a vapor generator in a manner similar to that described above. The vapor generator is mounted in a vacuum or controlled atmosphere chamber. The gas for the atomization may be either an inert or a reactive gas. When the atomization gas is inert, a separate reactive gas can be mixed and reacted with the precursor gas as it contacts the substrate surface. The reaction between the vaporized precursor and the reactive gas is driven with thermal energy from the hot substrate (CVD), or from plasma energy (PECVD). The precursor materials are typically organometallic compounds, as described above. The resultant coatings are generally inorganic thin films. In many cases, the substrate is a discrete part rather than a continuous roll of film. Suitable substrates include silicon wafers, electronic or optical devices, glass, metal, and plastic parts.

The process described above is useful for forming substrates with an inorganic layer with good electrical, optical, or barrier properties, as is well-known in the CVD and PECVD art. Additional layers can be deposited to form electronic or optical devices.

The atomization process disclosed herein may further be utilized in spray coating processes, wherein the atomization liquid is atomized and the droplets are directed to a substrate to form a coating on the surface. The atomization gas is typically air or an inert gas. The flow of the atomized mist may be directed and shaped by the use of an additional carrier gas or the use of electrostatics, as is known in the art of spray coating. Suitable coating materials include monomers, polymers, particles, bioactive molecules, solvents, water, and mixtures thereof. When solvents or water are used in mixtures with other coating components, the solvent or water can be evaporated from the droplets prior to coating, or evaporated from the coating. The substrate can be a continuous web of material including plastic and metallic films, nonwovens, fabrics, and other textiles, or the substrate can be a discrete object including silicon wafers, glass, plastic part, metal parts, and ceramic parts.

The process described above is useful for forming constructions with good electrical or optical properties. When applied to porous substrates, the coatings can enable filtration, stain blocking, soil release, color, fire retardant, adhesive, release, abrasive, and mechanical strength properties.

The process described above is also useful for forming constructions with biological activity. Layers containing proteins, peptides, nucleic acids, polynucleic acids, enzymes, drugs, and materials that bind biological molecules can be formed to create diagnostic devices, micro-reactors, drug delivery devices, and biomaterials with specific biological function.

As described above, the atomization process disclosed herein is useful for the production of moisture and oxygen resistant barrier films that are useful in the manufacture of many products, for example, as packaging for food and drugs and for the protection of environmentally sensitive electronic devices. Electronic devices that degrade when exposed to environmental moisture and oxygen are often protected from exposure by encasing the device in glass. A particularly useful application of barrier films made by the process disclosed herein includes protection for electronic display and signage devices, such as liquid crystal displays (LCDs), light emitting diodes (LEDs), organic light emitting diodes (OLEDs), light emitting polymers (LEPs), electrochromic, electrophoretic inks, inorganic electroluminescent devices, phosphorescent devices, and the like.

Other useful applications for barrier films include the protection of solar cells, photovoltaics, micro-electronics, organic micro-electronic devices (OMED), nano-devices, and nano-structures. Still other useful applications for barrier films include bio-active devices such as those used in analytical measurements of bio-active materials, bio-active-microelectronic devices used for analysis or separations. In addition to providing a barrier to environmental moisture and oxygen, barrier films made by the process disclosed herein are flexible, making possible the production of flexible displays, electrical devices, and bio-active devices.

The method disclosed herein may also be used to produce single or multi-layer films for applications such as optical films (reflectors, antireflection, absorbers, colored, optically variable, optical filters, optical interference filters, infrared reflectors), EMI (Electromagnetic Interference) filters, release coatings, transparent conductive films, sensors, and display films. Such films are described in the following U.S.

patents and publications, incorporated by reference herein: U.S. Pat. No. 5,877,895 (Shaw et al.); U.S. Pat. No. 6,172,810 (Fleming et al.); U.S. Pat. No. 6,815,043 (Fleming et al.); U.S. Pat. No. 6,818,291 (Funkenbusch et al.); U.S. Pat. No. 6,929,864 (Fleming et al.); U.S. Pat. No. 6,357,880 (Epstein et al.); 2005/0037218 (Lottes et al.); 2004/184948 (Rakow et al.); and 2003/0124392 (Bright).

EXAMPLE 1

Figure 2:
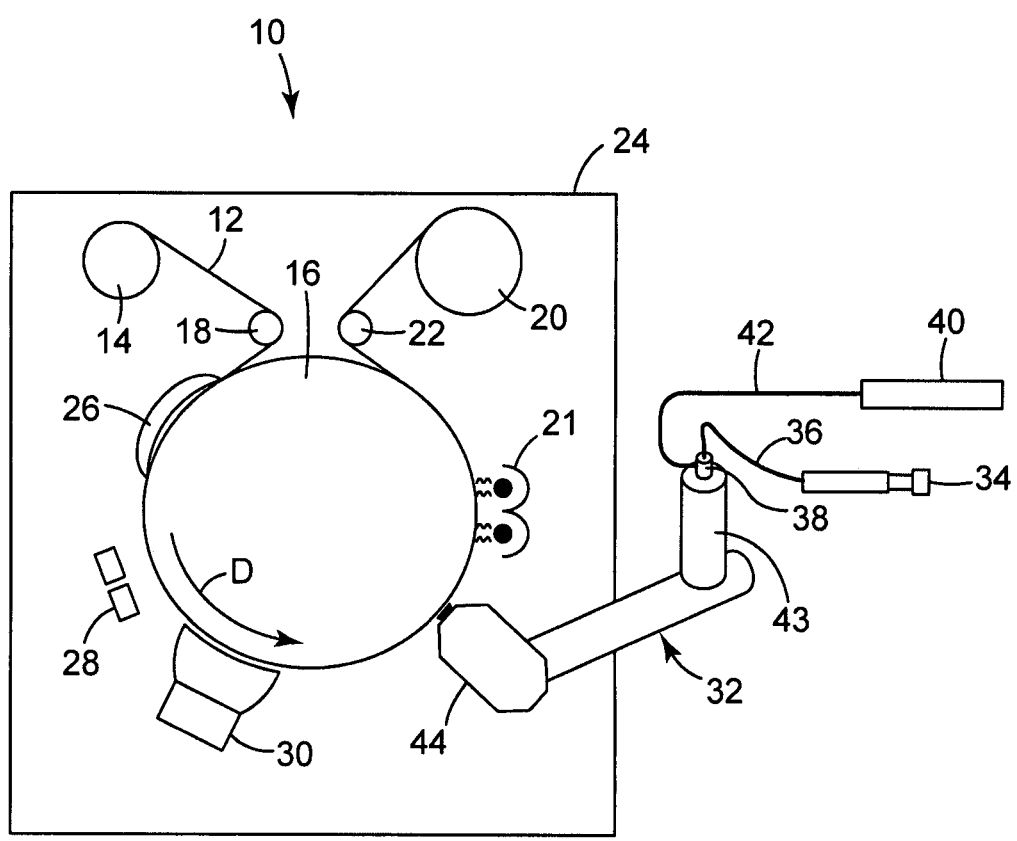
FIG. 2 shows a schematic view of a roll-to-roll process utilizing the atomizer of FIG. 1.

To provide a control, an apparatus for a roll-to-roll monomer vapor deposition process generally as depicted in FIG. 2 was constructed. This apparatus was provided with an atomizer constructed generally as depicted in FIG. 1. The apparatus was used to apply and then cure a coating to a substrate via monomer vapor deposition. The substrate used was Dupont-Teijin™ heat-stabilized PET film, 0.005 inch (0.13 mm) thick and 20 inches (50.8 cm) wide, commercially available as ST504, ST506 & ST725 from MacDermid Autotype Inc., Schaumburg, Ill. This film was moved past the coating nozzle at a speed of 16.2 feet/minute (8.2 cm/sec). During the coating the vacuum chamber was kept under a vacuum of 1.2× 10−4 torr. The coated substrate was then guided under an e-beam generator to initiate polymerization of the deposited monomer. The e-beam Spellman generator provided 7.5 kilovolts & 12.5 milliamps to the coated material for this purpose.

The atomizer was constructed such that the liquid supply conduit had a diameter of 0.040 inch (1 mm). A gas supply conduit was present, but for this control example, no gas was flowed into the conduit. The gas supply conduit entered the liquid supply conduit at a port 0.375 inch (0.95 cm) upstream of the outlet. The port was constructed so that it opened into substantially all the circumference of the liquid supply conduit.

The atomizer further had a piezoelectric transducer as a means for imparting vibrational energy to the outlet. The transducer was tuned to operate at a frequency of 60 kHz, and was operated with a range of 5.0 to 12.5 watts of energy.

During the experimental run, liquid monomer in the form of Acrylated polyol diacrylate commercially available as IRR214 from CYTEC Industries Inc. of Smyrna, Ga. was flowed from a dispenser through a liquid delivery line having two sections that were heated to 120 degrees F. The first section was a stainless steel line 72 inches (183 cm) long, with a diameter of 0.030 inch (0.76 mm). The second section was a Teflon™ line 24 inches (61 cm) long, with a diameter of 0.023 inch (0.58 mm). The monomer was flowed into the atomizer at a rate of 1.75 ml/min. This flow was calculated to give a nominal coating thickness of 725 nm at a line speed of 16.2 fpm and 500 nm thickness at a line speed of 22.5 fpm.

EXAMPLE 2

A second, experimental run was made generally as described in Example 1, except that dry nitrogen at a temperature of 100° C. was flowed into the gas supply conduit at a rate of 18 standard cubic centimeters per minute.

EXAMPLE 3

The operating parameters of the coating processes of control Example 1 and inventive Example 2 were measured in three ways to assess the ability of the invention to improve monomer vapor deposition by reducing process variability. First, the pressure in the evaporator downstream of the atomizer was measured. This was accomplished by use of a Model 631A High Temperature Manometer instrument, commercially available from MKS Instruments Inc. of Methuen, Mass., and data was taken every 1 second.

Second, the variability of the thickness of the deposited coating in a crossweb sense was measured using the spectral reflectance method across the width of the web, with assessment being made every 5 mm across the width. This process was repeated 10 times, each time taking a sample 2.5 cm downweb from the previous sample.

Third, the data was reanalyzed to highlight the variability of the mean thickness of the deposited coating in the downweb direction. The results of these measurements are shown in Table 1.

TABLE 1

| Example | Evaporator pressure variation (100*SD/Mean) | Crossweb thickness variation (100*SD/Mean) | Downweb thickness variation (100*SD/Mean) |
|---|---|---|---|
| 1 | 9.05 | 3.4 | 3.92 |
| 2 | 1.43 | 2.5 | 0.48 |

These results illustrate that the method of the invention is effective in reducing process variability in a process requiring atomization.

EXAMPLE 4

A further example was created with an apparatus for a roll-to-roll monomer vapor deposition process generally as depicted in FIG. 2, with the process chamber being approximately at atmospheric pressure, and an atomizer constructed generally as depicted in FIG. 1. The apparatus was used to apply and then cure a coating to a substrate via monomer vapor deposition. During the coating the process chamber was purged with nitrogen to maintain a positive pressure of 2.7 inches of water. The substrate used was DuPont Type 453 PET film, 0.002 inch (0.05 mm) thick and 12 inches (30.5 cm) wide, commercially available from Transilwrap Company, Franklin Park, Ill. This film was moved past the coating nozzle at a speed of 3.3 feet/minute (1.7 cm/sec). The coated substrate was then guided under six lamps emitting UV light of 254 nm and 185 nm wavelength (lamp numbers G18T6L and G18T6VH from Atlantic Ultraviolet of Hauppauge, N.Y.) to initiate polymerization of the deposited monomer.

The atomizer and gas supply conduit were constructed as described in Example 1, except that for this example, a flow rate of 15 cc/min of nitrogen was introduced through the gas supply conduit.

During the experimental run, liquid monomer in the form of trimethylolpropane triacrylate commercially available as SR351 LV from Sartomer Company of Exton, Pa. was flowed from a dispenser through a liquid delivery line into the top of the atomizer. The monomer was flowed into the atomizer at a rate of 0.1 ml/min. This flow resulted in a nominal coating thickness of 151 nm at a line speed of 3.3 fpm.

While the invention has been particularly shown and described with reference to various embodiments thereof, it will be understood by those skilled in the art that various other changes in the form and details may be made therein without departing from the spirit and scope of the invention.

What is claimed is:

1. A method for atomizing a liquid, comprising:
providing an atomizer comprising
a liquid supply conduit having an outlet at one end of a bore running through the center of an atomizing surface, the atomizing surface having a conical head positioned adjacent to the outlet, a gas supply conduit opening into the liquid supply conduit upstream of the outlet, and means for imparting vibrational energy to the outlet;

flowing a liquid stream through the liquid supply conduit bore to the outlet while simultaneously flowing gas through the gas supply conduit; and imparting vibrational energy to the atomizer from the means for imparting vibrational energy to the outlet to atomize from the atomizing surface the liquid stream after exiting from the outlet.

2. The method of claim 1, wherein the liquid supply conduit and the gas supply conduit are coaxially displaced relative to one another.

3. The method of claim 1 wherein the gas is inert with respect to the liquid.

4. The method of claim 1 where in the gas is reactive.

5. The method of claim 4 wherein the gas is taken from the group consisting of oxygen, ozone, nitrous oxide, hydrogen, hydrogen sulfide, carbon tetrafluoride, methane, and ammonia.

6. The method of claim 1, wherein the liquid is a monomer.

7. The method of claim 6, wherein the liquid is an (meth) acrylate monomer.

8. The method of claim 1 wherein the gas flowed through the gas supply conduit is heated above 90° C.

9. The method of claim 1 wherein the liquid flowed through the liquid supply conduit is heated above 30° C.

10. The method of claim 1 wherein the gas supply conduit opens into the liquid supply conduit around at least 80 percent of the bore of the liquid supply conduit.

11. The method of claim 1, wherein the gas is supplied to the gas supply conduit at a rate of less than 500 SCCM.

12. The method of claim 1, wherein the liquid is supplied to the liquid supply conduit at a rate of less than 10 ml/min.

13. The method of claim 1, wherein the means for imparting vibrational energy is a piezoelectric transducer.

14. A method for coating a substrate comprising:
providing a substrate;
providing an atomizer comprising
a liquid supply conduit having an outlet at one end of a bore running through the center of an atomizing surface, the atomizing surface having a conical head positioned adjacent to the outlet,
a gas supply conduit opening into the liquid supply conduit upstream of the outlet, and
means for imparting vibrational energy to the outlet;
flowing a liquid stream through the liquid supply conduit bore to the outlet while simultaneously flowing gas through the gas supply conduit; and
imparting vibrational energy to the atomizer from the means for imparting vibrational energy to the outlet to atomize from the atomizing surface the liquid stream after exiting from the outlet, and
depositing the atomized liquid onto the substrate.

15. The method of claim 14, wherein the substrate is polymeric.

16. The method of claim 15, wherein the substrate is made from a material taken from the group consisting of polypropylene (PP), polyethylene terephthalate (PET), fluorene polyester (FPE), polymethylmethacrylate (PMMA), polyethylene naphthalate (PEN), polyethersulphone (PES), polyestercarbonate (PC), polyetherimide (PEI), polyarylate (PAR), polyimide (PI), and polycyclic olefins.

17. The method of claim 14, wherein the substrate includes an electronic device.

18. The method of claim 14, wherein the liquid is a monomer.

19. The method of claim 18, wherein the liquid is a (meth) acrylate monomer.

20. The method of claim 19, wherein the (meth)acrylate monomer is polymerized by exposure to a curing source.

21. The method of claim 20, wherein the substrate is further coated with a layer of metal oxide.

22. A method for coating a substrate comprising:
providing a substrate;
providing an atomizer comprising
a liquid supply conduit having an outlet at one end of a bore running through the center of an atomizing surface, the atomizing surface having a conical head positioned adjacent to the outlet,
a gas supply conduit opening into the liquid supply conduit upstream of the outlet, and
means for imparting vibrational energy to the outlet;
flowing a liquid stream through the liquid supply conduit bore to the outlet while simultaneously flowing gas through the gas supply conduit; and
imparting vibrational energy to the atomizer from the means for imparting vibrational energy to the outlet to atomize from the atomizing surface the liquid stream after exiting from the outlet, evaporating the atomized liquid to form a vapor, and condensing the vapor onto the substrate.

23. The method of claim 22, wherein the liquid is a monomer.

24. The method of claim 23, wherein the liquid is a (meth) acrylate monomer.

25. The method of claim 24, wherein the (meth)acrylate monomer is polymerized by exposure to a curing source.

26. The method of claim 25, wherein the substrate is further coated with a layer of metal oxide.

27. A method for coating a substrate comprising:
providing a substrate;
providing an atomizer comprising
a liquid supply conduit having an outlet at one end of a bore running through the center of an atomizing surface, the atomizing surface having a conical head positioned adjacent to the outlet,
a gas supply conduit opening into the liquid supply conduit upstream of the outlet, and
means for imparting vibrational energy to the outlet;
flowing a liquid stream through the liquid supply conduit bore to the outlet while simultaneously flowing gas through the gas supply conduit; and
imparting vibrational energy to the atomizer from the means for imparting vibrational energy to the outlet to atomize from the atomizing surface the liquid stream after exiting from the outlet, evaporating the atomized liquid to form a vapor, and contacting the vapor with the substrate surface in the presence of a reactive gas.

28. The method of claim 27, wherein the liquid is a monomer.

29. The method of claim 28, wherein the liquid is a (meth) acrylate monomer.

30. The method of claim 29, wherein the (meth)acrylate monomer is polymerized by exposure to a curing source.

31. The method of claim 30, wherein the substrate is further coated with a layer of metal oxide.

* * * * *